US009741450B2

(12) United States Patent
Bouzekri Alami

(10) Patent No.: US 9,741,450 B2
(45) Date of Patent: Aug. 22, 2017

(54) MEMORY COMPRISING A CIRCUIT FOR DETECTING A GLITCH ON A LINE OF THE MEMORY

(71) Applicant: INSIDE SECURE, Meyreuil (FR)

(72) Inventor: Salwa Bouzekri Alami, Aix en Provence (FR)

(73) Assignee: INSIDE SECURE, Meyreuil (FR)

( * ) Notice: Subject to any disclaimer, the term of this patent is extended or adjusted under 35 U.S.C. 154(b) by 0 days.

(21) Appl. No.: 14/769,648

(22) PCT Filed: Feb. 18, 2014

(86) PCT No.: PCT/FR2014/050336
§ 371 (c)(1),
(2) Date: Aug. 21, 2015

(87) PCT Pub. No.: WO2014/135758
PCT Pub. Date: Sep. 12, 2014

(65) Prior Publication Data
US 2016/0012919 A1    Jan. 14, 2016

(30) Foreign Application Priority Data

Mar. 6, 2013  (FR) ..................................... 13 52007

(51) Int. Cl.
| G11C 29/08 | (2006.01) |
| G11C 29/50 | (2006.01) |
| G11C 7/24 | (2006.01) |
| G11C 8/20 | (2006.01) |
| G11C 11/4078 | (2006.01) |
| G11C 16/22 | (2006.01) |
| G11C 7/00 | (2006.01) |

(52) U.S. Cl.
CPC ................ *G11C 29/50* (2013.01); *G11C 7/00* (2013.01); *G11C 7/24* (2013.01); *G11C 8/20* (2013.01); *G11C 11/4078* (2013.01); *G11C 16/22* (2013.01); *G11C 29/08* (2013.01); *G11C 2029/5004* (2013.01)

(58) Field of Classification Search
CPC ................................. G11C 5/147; G11C 29/08
USPC .................................................... 365/201, 226
See application file for complete search history.

(56) References Cited

U.S. PATENT DOCUMENTS

| 4,812,675 A | 3/1989 | Goetting |
| 5,119,292 A * | 6/1992 | Baker ................... G06F 13/374 710/113 |
| 6,879,518 B1 | 4/2005 | Curry |

(Continued)

OTHER PUBLICATIONS

Jul. 23, 2014 International Search Report issued in International Patent Application No. PCT/FR2014/050336.

(Continued)

*Primary Examiner* — Michael Tran
(74) *Attorney, Agent, or Firm* — Brakes Hughes Bellermann LLP

(57) ABSTRACT

A memory including at least one line to which memory cells are coupled. A control circuit is configured to emit an end-of-operation signal at the end of the execution of an operation on at least one memory cell, and a glitch detection circuit coupled to the memory line is configured to supply a glitch detection signal when a falling edge of the amplitude of a voltage signal appears on the memory line in the absence of the end-of-operation signal.

21 Claims, 7 Drawing Sheets

(56) References Cited

U.S. PATENT DOCUMENTS

| | | | | |
|---|---|---|---|---|
| 7,127,552 B2* | 10/2006 | Shimanek | ................ | G11C 7/24 |
| | | | | 365/185.21 |
| 7,263,002 B2* | 8/2007 | Omoto | ................... | G11C 7/062 |
| | | | | 365/185.11 |
| 7,305,596 B2* | 12/2007 | Noda | ................... | G06F 11/1068 |
| | | | | 365/185.09 |
| 7,376,042 B2* | 5/2008 | Schnell | ................ | G11C 7/1072 |
| | | | | 365/189.09 |
| 7,379,345 B2* | 5/2008 | Omoto | ................... | G11C 7/062 |
| | | | | 365/185.11 |
| 7,619,944 B2* | 11/2009 | Fisch | .................... | G11C 11/406 |
| | | | | 365/191 |
| 8,254,186 B2* | 8/2012 | Hoefler | ................. | G11C 17/18 |
| | | | | 365/189.16 |
| 8,891,301 B1* | 11/2014 | Shlick | .................... | G11C 5/005 |
| | | | | 365/185.03 |
| 2006/0277434 A1* | 12/2006 | Tsern | ................. | G06F 11/1008 |
| | | | | 714/17 |
| 2008/0137455 A1 | 6/2008 | Ehrenreich et al. | | |
| 2015/0016207 A1* | 1/2015 | Louie | .................... | G11C 5/148 |
| | | | | 365/229 |
| 2015/0128007 A1* | 5/2015 | Kim | ....................... | G11C 29/52 |
| | | | | 714/763 |

OTHER PUBLICATIONS

Sep. 8, 2015 International Preliminary Report on Patentability issued in International Patent Application No. PCT/FR2014/050336.

* cited by examiner

MEMORY COMPRISING A CIRCUIT FOR DETECTING A GLITCH ON A LINE OF THE MEMORY

The present invention relates to a memory comprising a circuit for detecting an unauthorized glitch on a line of the memory, and a method of detecting such a glitch.

Figure 1:
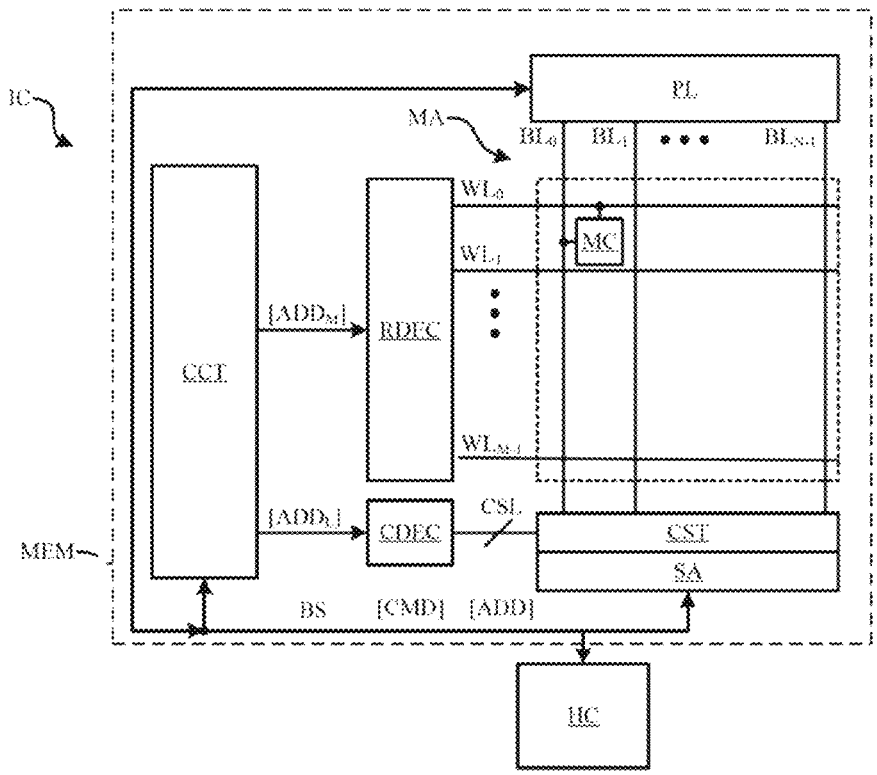

FIG. 1 shows an integrated circuit IC comprising a memory MEM and a host processor HC. The memory MEM comprises an array MA of memory cells MC (only one of which is shown), word lines $WL_m$ ($WL_0$ to $WL_{M-1}$), bit lines $BL_n$ ($BL_0$ to $BL_{N-1}$), a row decoder RDEC, a column decoder CDEC, a group of programming latches PL, a group of column select transistors CST, a group of sense amplifiers SA, and a control circuit CCT. Each memory cell is connected to one word line $WL_m$ and to one bit line $BL_n$. The word lines $WL_m$ have one end coupled to the row decoder RDEC, and the bit lines $BL_n$ is have one end coupled to the program latches PL and another end coupled to the sense amplifiers SA through the transistors CST. The latter are controlled by the column decoder CDEC through column select lines CSL. The control circuit CCT is coupled to the host processor HC, to the inputs of the program latches PL, and to the outputs of the sense amplifiers SA via a bus BS. The control circuit CCT receives read, program, or erase commands CMD sent by the host processor HC. Such commands include addresses ADD of memory cells and may include data to be written. The addresses may be divided into most significant addresses $ADD_M$ and least significant addresses $ADD_L$. The control circuit supplies the most significant address $ADD_M$ to the row decoder and the least significant address $ADD_L$ to the column decoder CDEC to select the memory cells. To execute a read, program, or erase operation on one or more selected memory cells, a voltage value, for example 5V or more, is applied to a word line $WL_m$. The un-selected word lines are generally grounded.

Such an integrated circuit IC may be subjected to attacks attempting to discover the sensitive data and/or influence the operations being executed. In an attack known as "laser fault injection", a laser source produces a laser beam with controlled wavelength and penetration depths. The laser beam is focused on a specific area of the circuit to generate transient electrical signals without any destructive effect on the circuit such that the attack is reproducible. Probes are put into contact with the circuit, allowing an attacker to deduce data or to analyze an operation being executed.

In particular, the memory MEM may be subjected to an attack at the input to the row decoder RDEC or within the circuitry of the row decoder controlling the word lines. As a result, a glitch, equivalent to a logic signal switching to the value 1, may appear on one or more word lines that are not selected, and trigger an undesirable operation on memory cells. Data may thus be unintentionally programmed or erased. When the memory is used to store important data, such as identification keys, codes, application data, etc., it is desirable to ensure the integrity of the data written in and read from the memory. It may therefore be desired to prevent this kind of attack.

Some embodiments of the invention relate to a memory comprising a control circuit for executing operations on memory cells, and at least one line to which memory cells are coupled, wherein the control circuit is configured is to emit an end-of-operation signal at the end of the execution of an operation on at least one memory cell, the memory comprising at least one glitch detection circuit coupled to the memory line and configured to supply a glitch detection signal when a falling edge of the amplitude of a voltage signal appears on the memory line in the absence of the end-of-operation signal.

According to one embodiment, the control circuit is configured to, during the execution of the operation on the memory cell, apply a voltage signal on the memory line and once the operation is over, emit the end-of-operation signal before ceasing to apply the voltage signal on the memory line, then ceasing to apply the end-of-operation signal after ceasing to apply the voltage signal to the memory line.

According to one embodiment, the control circuit is configured to, once the operation is over, emit the end-of-operation signal for less than 20 nanoseconds.

According to one embodiment, the glitch detection circuit comprises detection means configured to transform a voltage signal present on the memory line into a logic signal having a first logic value when the amplitude of the voltage signal is below a threshold and a second logic value when the amplitude of the voltage signal is above the threshold, storing means for storing a switching of the logic signal from the first to the second logic value, and means for supplying a glitch detection signal when the logic signal has the first logic value while the storing means have stored the switching of the logic signal to the second logic value, except if the end-of-operation signal is present.

According to one embodiment, the storing means are configured to be erased once the end-of-operation signal has been emitted.

According to one embodiment, the glitch detection circuit comprises detection means configured to transform a voltage signal present on the memory line into a logic signal having a first logic value when the amplitude of the voltage signal is below a threshold and a second logic value when the amplitude of the voltage signal is above the threshold, and a logic flip-flop configured to supply a glitch detection signal when the logic signal goes from the second to the first logic value.

According to one embodiment, the glitch detection circuit comprises a glitch storage circuit supplying a glitch detection signal which persists after the end-of-operation signal has been emitted.

According to one embodiment, the memory line is a word line, a control gate line, or an erase line.

According to one embodiment, the memory comprises a plurality of lines and a plurality of glitch detection circuits each coupled to a line of the memory and each receiving the end-of-operation signal, and means for supplying a collective glitch detection signal that is a function of individual glitch detection signals supplied by the detection circuits.

According to one embodiment, the control circuit is configured to emit the end-of-operation signal at the end of an operation chosen among an operation of reading, writing, or erasing a memory cell.

According to one embodiment, the control circuit is configured not to emit the end-of-operation signal when it does not execute any operation on memory cells.

Some embodiments of the invention also relate to a method for monitoring a line of a memory susceptible of receiving a glitch that may be representative of a fault injection attack, the memory comprising memory cells coupled to the memory line, the method comprising the steps of emitting an end-of-operation signal at the end of the execution of an operation on at least one memory cell, and supplying a glitch detection signal when a falling edge of the amplitude of a voltage signal appears on the memory line in the absence of the end-of-operation signal.

According to one embodiment, the method comprises the steps of, during the execution of the operation on the memory cell, applying a voltage signal to the memory line, and once the operation is over, emitting the end-of-operation signal before ceasing to apply the voltage signal to the memory line, then ceasing to emit the end-of-operation signal after ceasing to apply the voltage signal to the memory line.

According to one embodiment, the end-of-operation signal is emitted for less than 20 nanoseconds.

According to one embodiment, the method comprises the step of not emitting the end-of-operation signal when no operation is executed on memory cells, to detect a glitch outside periods when the memory cells are used.

Figure 2:
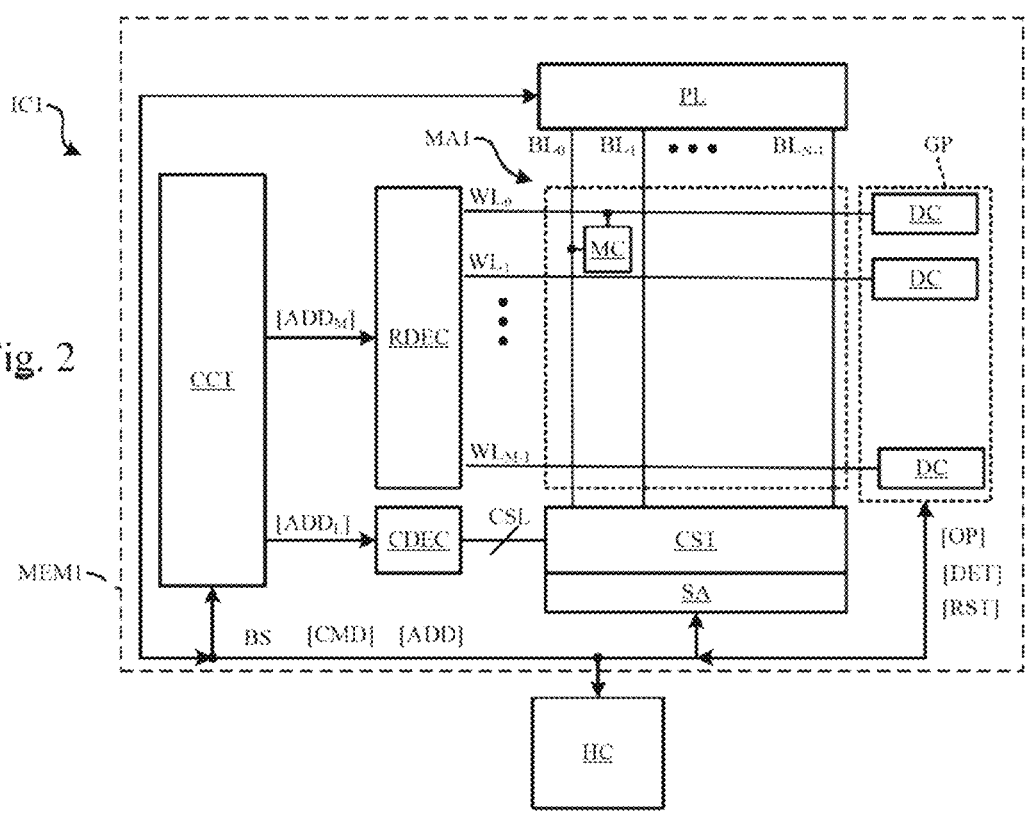
Figure 3:
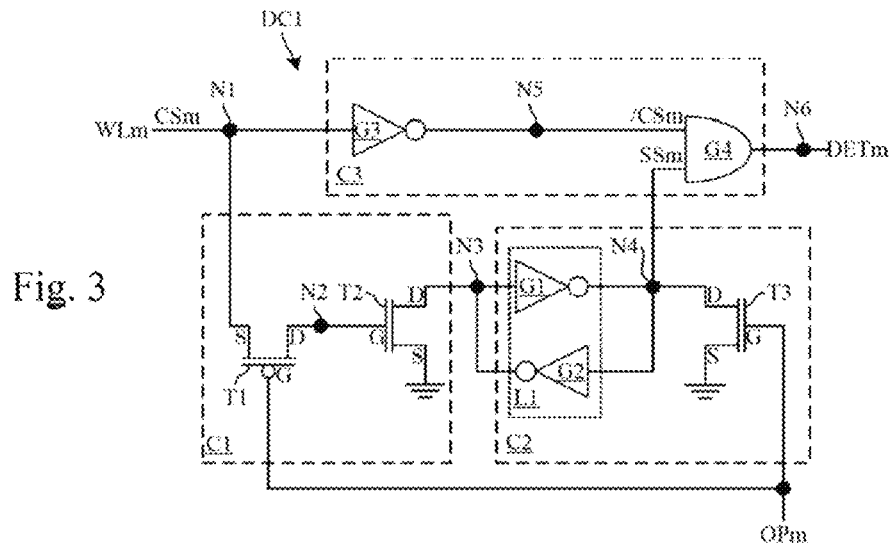
Figure 4:
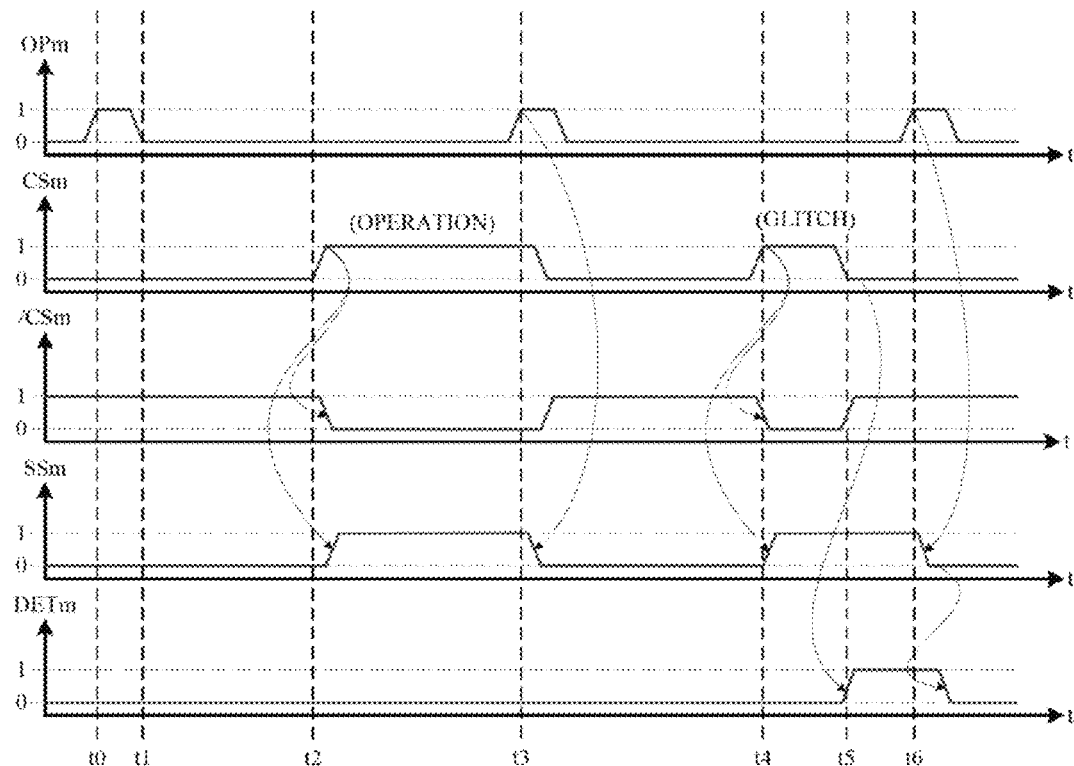
Figure 5:
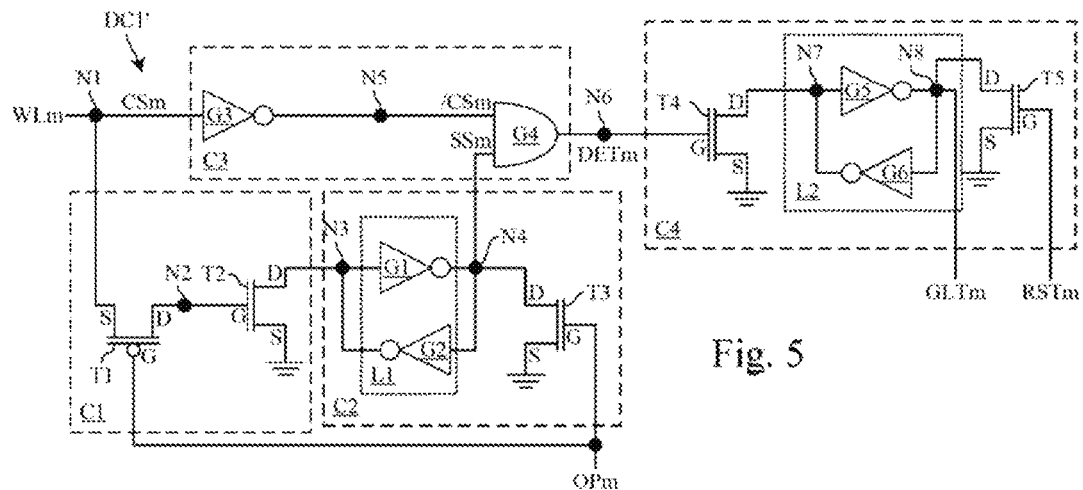
Figure 6:
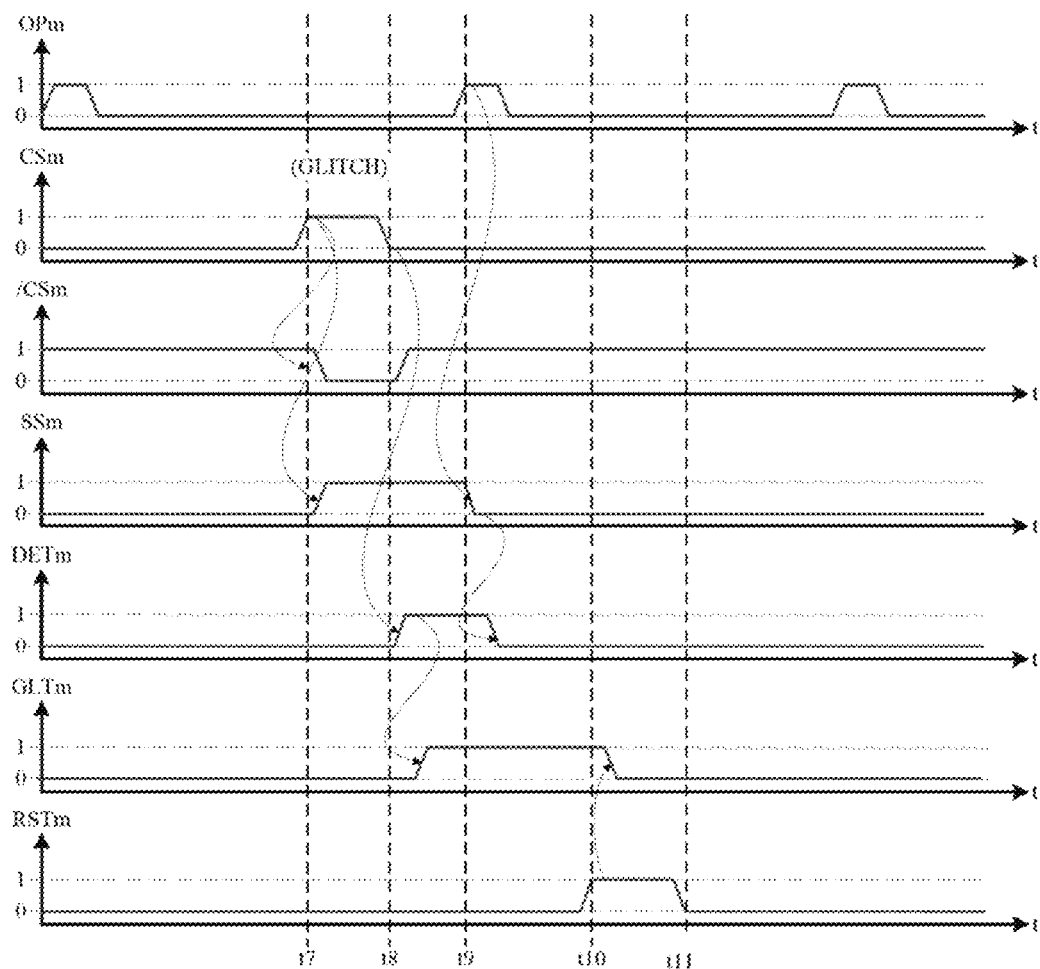
Figure 7:
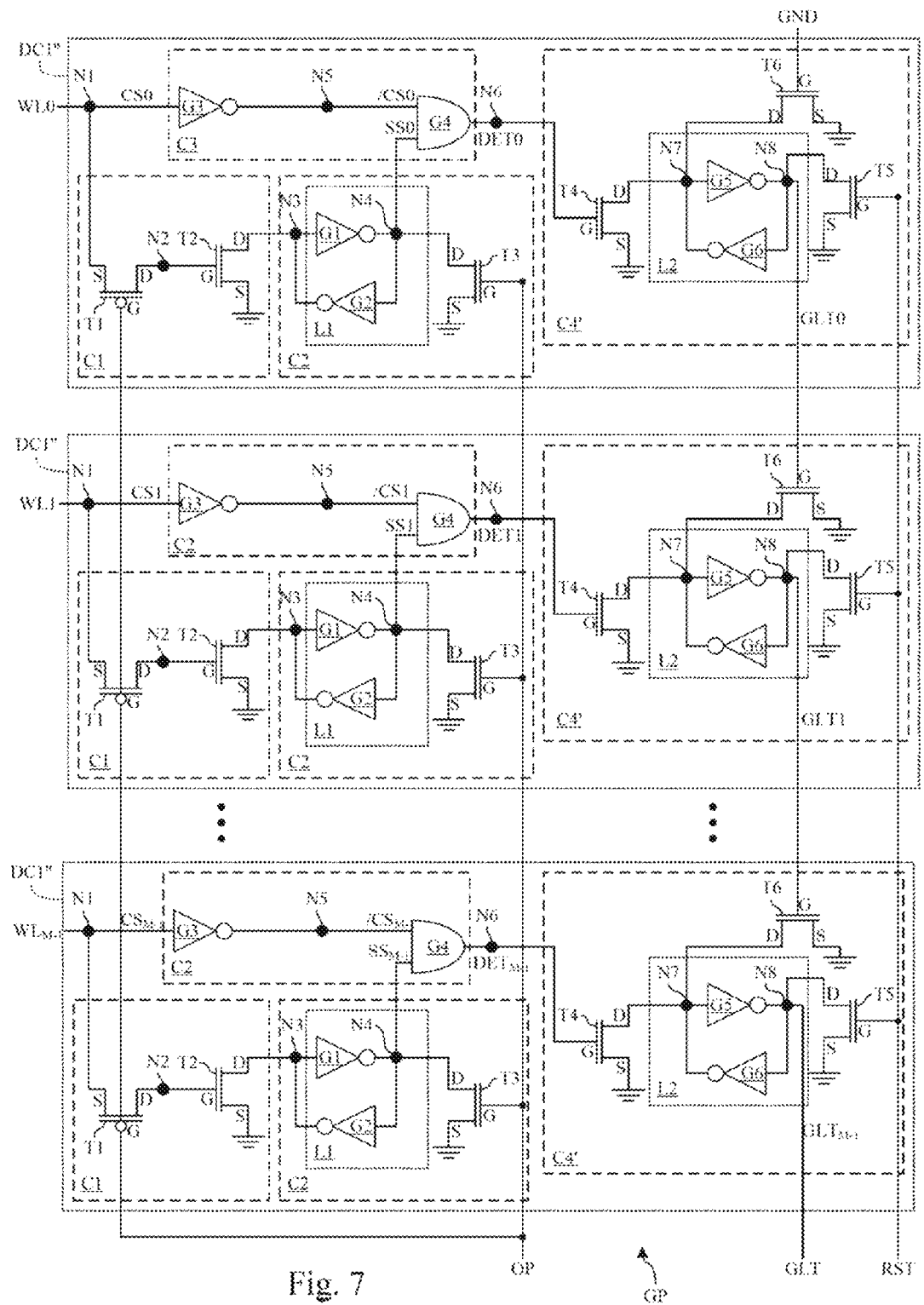
Figure 8:
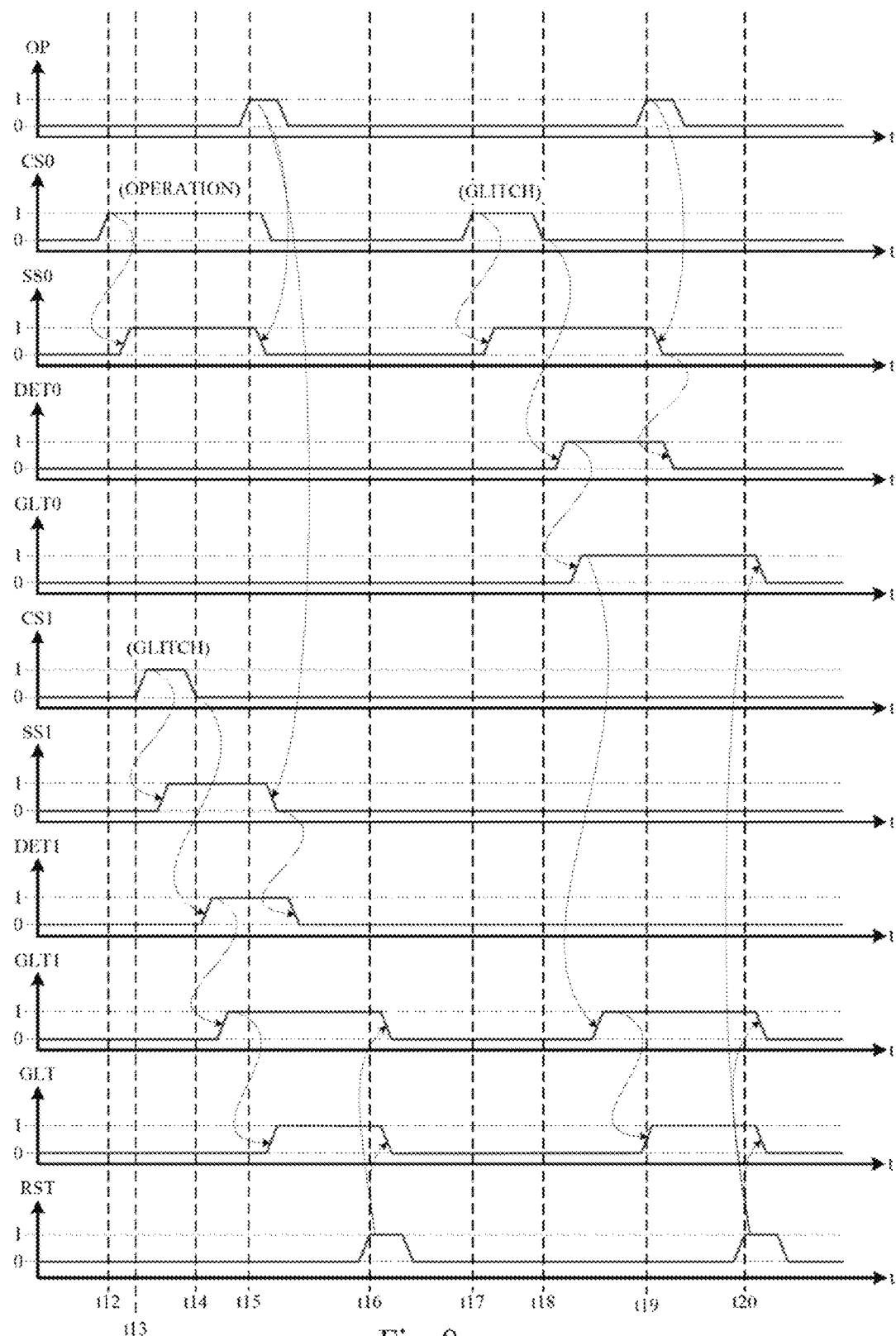
Figure 9:
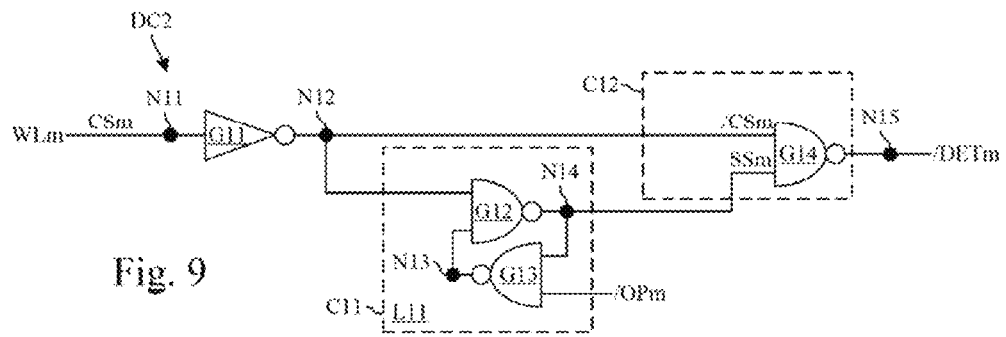
Figure 10:
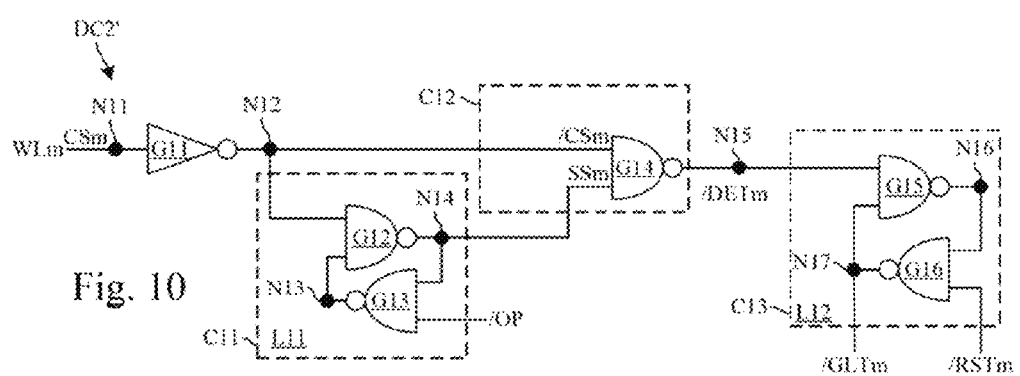
Figure 11:
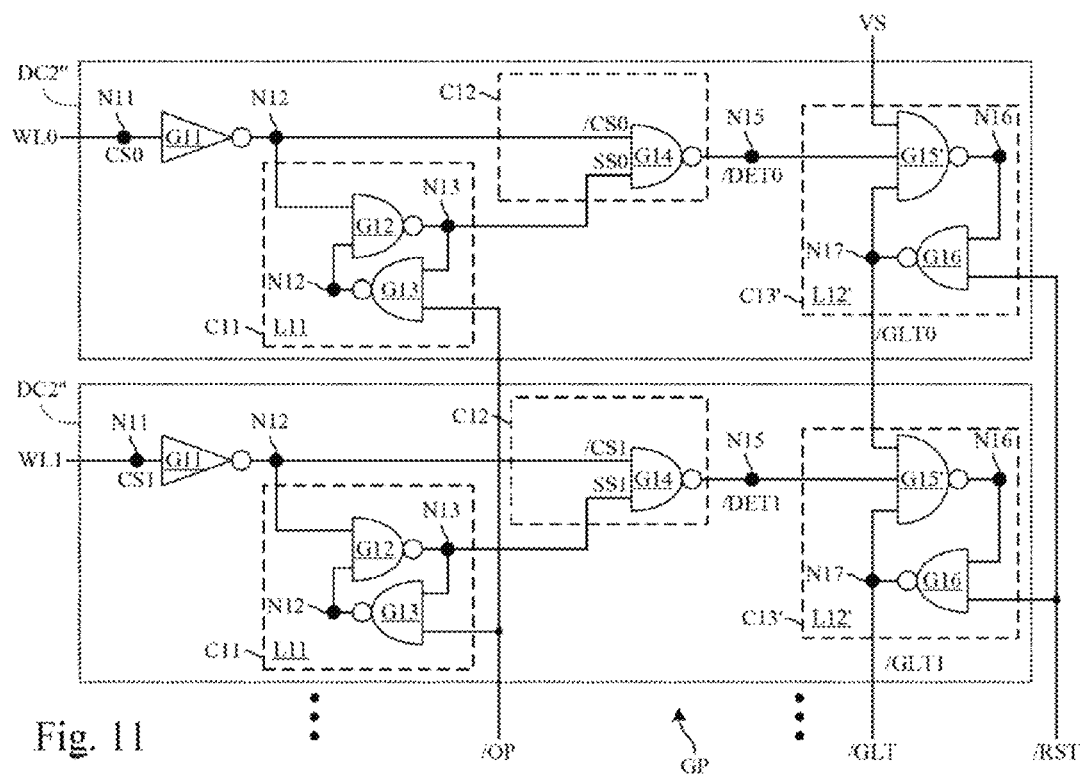
Figure 12:
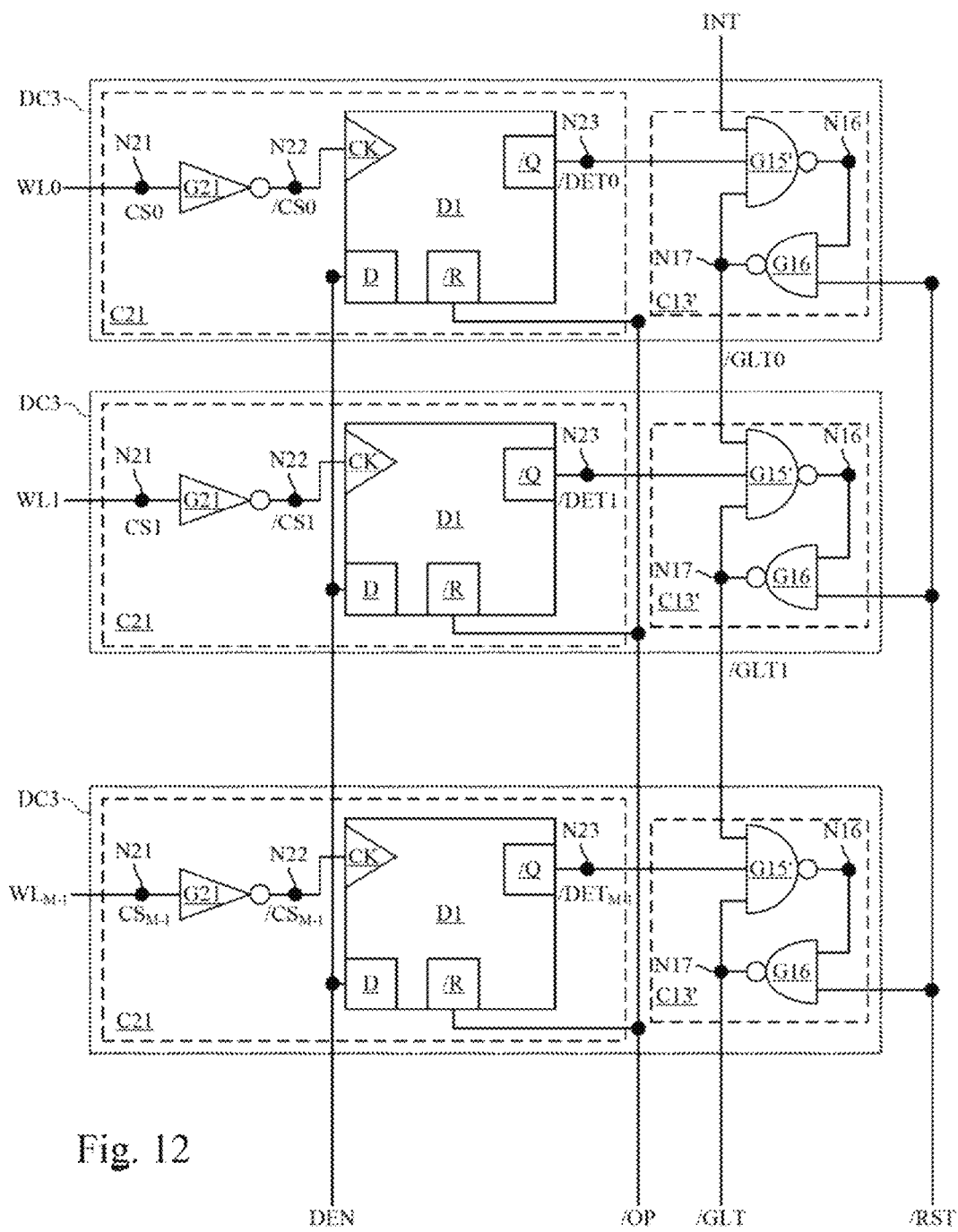

Some embodiments of a memory comprising a glitch detection circuit according to the invention and implementing a glitch detection method according to the invention will be described below in relation with, but not limited to, the appended figures, in which:

FIG. 1, previously described, is a schematic view of a conventional memory,

FIG. 2 is a schematic view of a memory comprising a glitch detection circuit according to the invention, FIG. 3 shows one embodiment of the glitch detection circuit in FIG. 2, FIG. 4 is a timing diagram showing a glitch detection by means of the detection circuit in FIG. 3, FIG. 5 shows an alternative embodiment of the glitch detection circuit in FIG. 3, FIG. 6 is a timing diagram showing a glitch detection by means of the detection circuit in FIG. 5, FIG. 7 shows an alternative embodiment of the glitch detection circuit in FIG. 5, FIG. 8 is a timing diagram showing a glitch detection by means of the circuit in FIG. 7, FIG. 9 shows another embodiment of a glitch detection circuit according to the invention, FIG. 10 shows an alternative embodiment of the detection circuit in FIG. 9, FIG. 11 shows an alternative embodiment of the glitch detection circuit in FIG. 10, and FIG. 12 shows another embodiment of a glitch detection circuit according to the invention.

FIG. 2 shows an integrated circuit IC1 comprising a memory MEM1 and a host processor HC. The memory MEM may be of the EEPROM ("Electrically Erasable and Programmable Memory"), Flash, EPROM, OTP ("One Time Programmable"), MTP ("Multiple Time Programmable"), ROM ("Read Only Memory") type, etc. As previously described in relation with FIG. 1, the memory MEM1 comprises a control circuit CCT, an array MA1 of memory cells MC (only one of which is shown) comprising word lines $WL_m$ ($WL_0$ to $WL_{M-1}$) and bit lines $BL_n$ ($BL_0$ to $BL_{N-1}$), each memory cell being connected to a word line $WL_m$ and to a bit line $BL_n$. The memory also comprises a row decoder RDEC, a column decoder CDEC, a group of programming latches PL, a group of column select transistors CST, a group of sense amplifiers SA.

The memory further comprises a group GP of detection circuits DC according to the present invention, for detecting unauthorized glitches. Each word line $WL_m$ has one end coupled to the row decoder RDEC, and another end coupled to one of the glitch detection circuits DC. The control circuit CCT is also coupled to the group GP of detection circuits DC, and supplies one or more end-of-operation signals OP thereto and receives one or more glitch detection signals DET therefrom. In some embodiments of the invention, the host processor further supplies a reset signal RST to the group of detection circuits DC.

Each detection circuit DC is configured to detect a glitch on the word line WL to which it is coupled when the amplitude of a voltage signal present on the word line has a falling edge, i.e. goes from a first value above a voltage threshold, corresponding here by convention to a logic 1, to a second value that is zero or below the voltage threshold, corresponding here by convention to a logic 0, while an operation is being executed on one or more memory cells. The end-of-operation signal OP acts as a means for distinguishing between an unauthorized falling edge appearing while an operation is being executed, and an authorized falling edge appearing at the end of an operation. To that end, the signal OP is put to a first logic value during the execution of an operation, this value being here by convention chosen equal to 0, and to a second logic value, here 1, at the end of an operation. For a better understanding of embodiments of the present invention, the value of the signal OP at the end of an operation, here the value "1", will be taken to correspond to the emission of the signal OP, and the value of the signal OP during the execution of an operation, here the value "0", will be taken to correspond to the absence of that signal.

FIG. 3 shows a first embodiment of a glitch detection circuit DC1 according to the invention. The circuit DC1 is coupled to a word line WLm of the memory array MA1, m being a word line index ranging here from 0 to M−1. Although only one word line is shown on the figure, a detection circuit DC1 may be provided for each word line ($WL_0$ to $WL_{M-1}$) of the memory array, or for a subset of word lines, such as word lines corresponding to a secure memory area.

The detection circuit DC1 comprises an input node N1, an output node N6, a state detection circuit C1, a state storage circuit C2, and a state change detector circuit C3. The node N1 is coupled to the word line WLm and the output node N6 supplies a glitch detection signal DET of rank m, referenced "DETm". For the sake of clarity, in the following description, "word line state signal" or "state signal" shall refer to a voltage signal CSm present on the word line WLm and considered as a logic signal, i.e. as being 1 or 0 if it is above or below a voltage threshold marking the limit between 0 and 1.

The state detection circuit C1 comprises a PMOS transistor T1 and an NMOS transistor T2. The transistor T1 has a conduction terminal (S) coupled to the node N1, another conduction terminal (D) coupled to a node N2, and receives on its control terminal (G) an end-of-operation signal OP of rank m, referenced OPm. The transistor T2 has a conduction terminal (S) coupled to the ground, another conduction terminal (D) coupled to a node N3 (latch input node), and a control terminal (G) coupled to the node N2.

The state storage circuit C2 comprises a latch L1 to store the state detected by means of the circuit C1 and an NMOS transistor T3 to reset the latch L1. The latch L1 comprises the input node N3, an output node N4, a first inverting gate G1, and a second inverting gate G2 mounted head-to-tail, the gate G1 having its input coupled to the node N3 and its output coupled to the node N4, and the gate G2 having its input coupled to the node N4 and its output coupled to the node N3. The gate G1 supplies the node N4 with a stored state signal SSm. The transistor T3 has a conduction terminal (S) coupled to the ground, another conduction terminal (D) coupled to the node N4, and a control terminal (G) receiving the end-of-operation signal OPm.

The state change detector circuit C3 comprises an inverting gate G3 and a two-input AND logic gate G4. The gate G3 is coupled at input to the node N1, to receive the state signal CSm of the word line WLm, and at output to a node N5, to supply an inverted state signal /CSm. The gate G4 has one input coupled to the node N5, and one input coupled to the node N4 of the circuit C2, and its output is coupled to the node N6.

FIG. 4 is a timing diagram of the operation of the detection circuit DC1 in FIG. 3 and shows the logic values of the end-of-operation signal OPm, of the state signal CSm (that is, the state of the word line WLm at the time considered), of the inverted state signal /CSm, of the stored state signal SSm, and of the detection signal DETm.

At a time t0, such as the power-up (initialization) of the memory MEM or at the end of a previous operation executed on the word line WLm or on another word line, the end-of-operation signal OPm is emitted (OPm=1). The transistor T1 is in the non-conducting or "blocked" state, and the transistor T3 is in the conducting state, thus linking the node N4 to the ground. The latch L1 is therefore initialized to 0, such that the stored state SSm is set to 0. The state signal CSm on the word line WLm is at 0, and the inverted signal /CSm is at 1. The gate G4 receives the signals /CSm=1 and SSm=0, such that the detection signal DETm is at 0 at output of the detection circuit DC1.

At a time t1, the signal OPm is no longer emitted (OPm=0) and the state signal CSm remains at 0. The transistor T1 goes into the conducting state whereas the transistor T3 becomes blocked. The transistor T2 applies the signal CSm=0 present at the node N1 to the control terminal of the transistor T2, such that the latter is blocked as well. The stored state SSm of the latch remains at 0. The gate G4 continues to receive the signals /CSm=1 and SSm=0 at input, such that the detection signal DETm remains at 0.

At a time t2, the state signal CSm goes to 1, due to the application of a voltage on the word line. The signal /CSm goes to 0 after a slight delay. The transistor T1 is still conducting since the end-of-operation signal OPm is still equal to 0, and applies the voltage value of the state signal CSm to the control terminal of the transistor T2, which goes into the conducting state. The node N3 is linked to the ground, while the transistor T3 remains blocked by the signal OPm equal to 0. The stored signal SSm at the output node N4 goes to 1 after a slight delay. The gate G4 thus receives the signals /CSm=0 and SSm=1 at input, such that the detection signal DETm remains at 0.

At a time t3, the end-of-operation signal OPm is emitted (OPm=1). The transistor T1 is again blocked, and the transistor T3 is set in the conducting state, linking the node N4 to the ground such that the stored state signal SSm is reset to 0. The state signal CSm is then also set back to 0 by the control circuit CCT, completing the operation (read, program, erase) on the word line WLm, while maintaining the signal OPm at 1. The gate G4 receives the signals /CSm=1 and SSm=0 at input, such that the detection signal DETm remains at 0. The signal OPm is then set back to 0, setting the transistor T1 in the conducting state and blocking the transistor T3.

At a time t4, while the end-of-operation signal OPm is at 0, an unauthorized voltage assimilated to the logic "1" is applied to the word line and the state signal CSm of the word line thus again returns to 1. The signal /CSm goes to 0 after a slight delay. As the end-of-operation signal OPm is at 0, the transistor T1 is in the conducting state and applies the unauthorized voltage to the control terminal of the transistor T2, setting it in the conducting state. The node N3 is linked to the ground, and the signal SSm at the node N4 goes to 1 after a slight delay. The gate G4 thus receives the signals /CSm=0 and SSm=1 at input, such that the detection signal DETm remains at 0.

At a time t5, the state signal CSm returns to 0, which corresponds to the disappearance of the unauthorized signal. The signal /CSm goes to 1, but since the end-of-operation signal OPm is still at 0 and has not yet been set back to 1 by the control circuit, the node N4 is not set back to 0 such that the stored state of the word line is unchanged, and the stored state SSm remains at 1. The gate G4 receives the signals /CSm=1 and SSm=1, and the detection signal DETm goes to 1, notifying that an unauthorized glitch has been detected on the word line.

At a time t6, the end-of-operation signal OPm is set back to 1. The transistor T3 is again in the conducting state, linking the node N4 to the ground such that the stored state signal SSm is reset to 0. The gate G4 thus receives /CSm=1 and SSm=0 at input, the detection signal DETm returns to 0. The signal OPm is then set back to 0, setting the transistor T1 in the conducting state and blocking the transistor T3.

Those skilled in the art will note from the timing diagram in FIG. 4 that the switching from 1 to 0 of the state signal CSm occurs after time t3 when the signal OPm has been set to 1, and before the latter is set back to 0. Thus, the switching from 1 to 0 of the signal Csm is not detected as a glitch as the value 1 of the signal OPm has the effect of resetting the latch C2 and maintaining it in the reset state (transistor T3 on, SSm=0). On the other hand, the switching to 0 of the signal CSm at time t5 is detected as an unauthorized glitch and causes the signal DETm to switch to 1 as that falling edge appears while the signal OPm is still at 0 and before it is set back to 1. An unauthorized glitch therefore distinguishes itself from a regular state signal CSm applied to the word line due to its asynchronous nature in relation to the end-of-operation signal OPm.

In some embodiments, the duration of an operation executed on memory cells is of the order of one millisecond to a few milliseconds, while the period of time between two operations, during which the signal OPm is set to 1, is very short, of the order of a few tens of nanoseconds.

In some embodiments, the time during which the signal OPm is emitted may be very short and shorter than the minimal time between two operations. In one embodiment, the time during which the signal OPm is emitted is less than 20 nanoseconds, for example 1 ns, 5 ns, 10 ns, 15 ns, and is preferably chosen equal to the minimal time necessary to reset the latch C2 to zero. In those conditions, it becomes almost impossible for an attacker to synchronize the falling edge of a signal injected into the memory with the times at which the signal OPm is emitted.

Those skilled in the art will also note that the logic value "1" of the unauthorized signal appearing on FIG. 4 from time t4 onwards, called state signal CSm, may correspond to a voltage amplitude on the word line that does not correspond exactly to the voltage generated by the memory to produce a logic "1". Similarly, the logic value "0" may correspond to a non-zero voltage amplitude on the word line. The inverting gate G3 has indeed, and in a conventional manner per se, a threshold voltage above which its output switches to 0 and below which its output switches to 1. This threshold voltage is conventionally the threshold voltage of the transistors that constitute it (not shown). Similarly, the transistor T2 forces the output of the latch C2 (signal SSm) to 1 when it receives a voltage signal above its threshold voltage. Thus, in the presence of an unauthorized signal the voltage value of which does not correspond precisely to the logic "1", the transistor T2 and the gate G3 behave like detection circuits that transform an injected voltage into a logic value "1" if the latter is above the above-mentioned threshold and into a logic value "0" if the latter is zero or below the above-mentioned threshold.

Some embodiments of the present invention may further provide for a detection of an unauthorized negative voltage and transform such a voltage into a logic "1" if the latter is above the considered threshold in absolute terms (independently of its sign). Such embodiments also detect an amplitude falling edge, the amplitude being considered as an absolute value independently of the sign of the voltage. It follows from the foregoing that a falling edge to be detected is generally a variation of the detected signal between a voltage value corresponding to the execution of an operation and a voltage value of not executing the operation.

Lastly, it was indicated in the foregoing that the end-of-operation signal is set to 0 during the execution of an operation and is set to 1 between two operations, to allow the signal Csm voluntarily applied to the word line to be reset to 0 without this being detected as an unauthorized glitch. A detection circuit according to the invention is however susceptible of other applications. For example, the signal OPm, after being emitted and resetting the detection circuit, may no longer be emitted and thus remain at 0 over a "rest" period during which no operation is executed on memory cells. The appearance on the word line of a voltage signal above the switching threshold of the gate G3 and the transistor T2, which has the effect of switching the signal /CSm to 0 and the signal SSm to 1, then the disappearance of that signal, which has the effect of switching the signal /CSm to 1 while the signal SSm remains at 1, will therefore be detected rightly as an unauthorized glitch. The detection circuit DC1 thus also allows the memory to be monitored during rest periods.

In some embodiments of the invention, it may further be desirable to latch the glitch detection signal DETm so that the glitch detection remains set even after the stored state SSm has been reset.

FIG. 5 shows a detection circuit DC1' comprising, in addition to the circuits C1, C2, C3 already described, a glitch detection storage circuit C4 supplying a stored glitch detection signal GLTm. The circuit C4 receives at input the glitch detection signal DETm and stores it until being reset by a reset signal RSTm. The reset signal RSTm is supplied for example by the host processor HC (cf. FIG. 2) upon power-up and after each glitch detection, so as to reset the stored glitch detection signal to 0.

The storage circuit C4 comprises a latch L2 and two NMOS transistors T4, T5. The latch L2 comprises an input node N7, an output node N8 supplying the signal GLTm, a first inverting gate G5, and a second inverting gate G6. The gates G5, G6 are mounted head-to-tail, the gate G5 having an input coupled to the node N7 and an output coupled to the node N8, the gate G6 having an input coupled to the node N8 and an output coupled to the node N7. The transistor T4 has one conduction terminal (S) coupled to the ground, another conduction terminal (D) coupled to the node N7, and its control terminal (G) is coupled to the node N6, at output of the gate G4. The transistor T5 has one conduction terminal (S) coupled to the ground, another conduction terminal (D) coupled to the node N8, and a control terminal (G) receiving the reset signal RSTm.

FIG. 6 is a timing diagram of the operation of the detection circuit DC1', showing the logic values of the end-of-operation signal OPm, of the state signal CSm, of the inverted state signal /CSm, of the stored state signal SSm, of the detection signal DETm, of the stored glitch detection signal GLTm, and of the reset signal RSTm. FIG. 6 only shows the case where an unauthorized glitch is detected. The operation of the circuit in the case where an operation is being executed (read, program, erase) is identical to that shown in FIG. 4, with the addition that, as no glitch is here detected, the reset signal RSTm and the stored glitch detection signal GLTm remain at 0, and the circuit C4 thus does not need to be reset.

At a time t7, the state signal CSm goes to 1. The signal /CSm goes to 0 after a slight delay. The end-of-operation signal OPm is absent (OPm=0), such that the transistor T1 is in the conducting state and the transistor T3 is blocked. The transistor T1 applies the logic value 1 to the control terminal of the transistor T2, setting it in the conducting state. The node N3 is linked to the ground, and the signal SSm at the output node N4 goes to 1 after a slight delay. The gate G4 thus receives the signals /CSm=O and SSm=1 at input, such that the detection signal DETm remains at 0.

At a time t8, the state signal CSm returns to 0. The signal /CSm goes to 1, but the stored state of the word line remains unchanged, such that SSm remains at 1. The gate G4 receives the signals /CSm=1 and SSm=1 at input. The detection signal DETm goes to 1, notifying that a glitch has been detected on the word line. The logic value 1 is applied to the control terminal of the transistor T4, setting it in the conducting state. The node N7 is coupled to the ground, and the output of the inverting gate G5 goes to 1 after a short delay. The stored glitch detection signal GLTm present at the node N8 of the latch L2 is set to 1.

At a time t9, the end-of-operation signal OPm is emitted (OPm=1). The transistor T1 is again blocked, and the transistor T3 is again in the conducting state, linking the node N4 to the ground such that the stored state signal SSm is reset to 0. The gate G4 thus receives /CSm=1 and SSm=0 at input, such that the detection signal DETm returns to 0 and is applied to the control terminal of the transistor T4, setting it in the blocked state. Nevertheless, the stored glitch detection signal GLTm remains at 1. Shortly thereafter, the end-of-operation signal OPm goes to 0, setting the transistor T1 in the conducting state and blocking the transistor T3.

At a time t10, the reset signal RSTm is set to 1. The transistor T5 is set in the conducting state, linking the node N8 to the ground. The stored glitch detection signal GLTm returns to 0, while the other signals are unaffected. Shortly thereafter, the reset signal RSTm is set back to 0, setting the transistor T5 in the blocked state.

In some embodiments of the invention, it may be desired to provide a global end-of-operation signal OP for a plurality of detection circuits. Furthermore, it may be desired to supply at output a global detection signal DET and/or a global detection signal GLT for the entire memory array, rather than supplying one per word line (DETm, GLTm). These two aspects will be implemented jointly in the following examples of embodiments, but may also be implemented independently of one another.

FIG. 7 shows a plurality of word lines WL0, WL1 . . . $WL_{M-1}$, each coupled to a detection circuit DC1", the detection circuits DC1" forming together the group GP of detection circuits. The end-of-operation signal OP and the reset signal RST are common to all the detection circuits. The detection circuits DC1" are cascade connected so that each detection circuit except for the first one receives the glitch detection signal supplied by a preceding detection circuit, and switches into a glitch detection state when the preceding detection circuit is itself in the glitch detection state, the last circuit DC1" supplying a global glitch detection signal GLT.

To that effect, the detection circuits DC1" each comprise a glitch detection storage circuit C4', which differs from the glitch detection storage circuit C4 previously described in that it further comprises an NMOS transistor T6 having a conduction terminal (S) coupled to the ground, another conduction terminal (D) coupled to the node N7, and its control terminal (G) receiving the stored glitch detection signal supplied by the detection circuit DC1" coupled to the preceding word line $WL_{m-1}$. Likewise, each output node N8 is coupled to the control terminal of the transistor T6 of the detection circuit DC1" coupled to the subsequent word line $WL_{m+1}$.

When a stored glitch detection signal GLTm goes to 1, the transistor T6 of the following detection circuit is set in the conducting state, linking the latch L2 input node N7 to the ground and setting the output node N8 to 1, such that the stored glitch detection signal propagates through all the other detection circuits, regardless of whether a glitch was detected on the other word lines.

It will be noted that the transistor T6 of the detection circuit DC1" coupled to the first word line WL0 of the memory array has its control terminal grounded GND, such that this transistor remains inactive. Alternatively, the first word line WL0 may be coupled to a detection circuit DC1' as described in relation with FIG. 5, which does not comprise this transistor.

FIG. 8 is a timing diagram of the operation of a detection circuit DC1" in FIG. 7. FIG. 8 shows the logic values of the end-of-operation signal OP, of the global glitch detection signal GLT, of the reset signal RST, of the signals CS0, SS0, DET0, GLT0, in relation with the word line WL0, and of the signals CS1, SS1, DET1, GLT1 in relation with the word line WL1.

At a time t12, the state signal CS0 goes to 1 while the end-of-operation signal OP is absent (OP=0). The signal SS0 goes to 1 after a slight delay, and the detection signal DET0 remains at 0. At a time t13, the state signal CS1 also goes to 1 while the end-of-operation signal OP remains at 0. The signal SS1 goes to 1 after a slight delay, and the detection signal DET1 remains at 0. At a time t14, the state signal CS1 returns to 0. The stored state SS1 of the word line WL1 remains unchanged, such that the detection signal DET1 goes to 1. The stored glitch detection signal GLT1 is set to 1, and propagates through the detection circuits coupled to the subsequent word lines WL2 to $WIL_{M-1}$. The global glitch detection signal GLT goes to 1 at output of the last detection circuit. At a time t15, the end-of-operation signal OP is emitted (OP=1). The stored state signals SS0, SS1 are reset to 0, the state signal CS0 and the detection signal DET1 return to 0. The stored glitch detection signals GLT1 ... and the global glitch detection signal GLT remain at 1. The state signal CS0 returns to 0. At a time t16, the reset signal RST is set to 1, linking the output nodes N8 to the ground. The glitch detection signals GLT1 ... GLT return to 0, while the other signals are unaffected. The reset signal RST is then set back to 0, setting the transistors T5 in the blocked state. Consequently, a glitch appearing on one or more word lines is detectable while at the same time, another word line is being used for an operation on memory cells.

At a time t17, the state signal CS0 goes to 1 while the end-of-operation signal OP is at 0. The signal SS0 goes to 1 after a slight delay, and the detection signal DET0 remains at 0. At a time t18, the state signal CS0 returns to 0. The stored state SS0 of the word line WL0 remains unchanged, and the detection signal DET0 goes to 1. The stored glitch detection signal GLT0 is set to 1, and propagates through the detection circuits linked to the subsequent word lines (WL1 to $WL_{M-1}$). Thus, the stored glitch detection signals GLT1 ... are all set to 1, and the global glitch detection signal GLT goes to 1 at output of the last detection circuit. At a time t19, the end-of-operation signal OP is emitted (OP=1). The stored state signal SS0 is reset to 0, and the detection signal DET0 returns to 0. The glitch detection signals GLT0, GLT1 ... GLT remain at 1. At a time t20, the reset signal RST is set to 1, linking the output nodes N8 to the ground. The glitch detection signals GLT0, GLT1 ... GLT return to 0, while the other signals are unaffected. The reset signal RST is then set back to 0, setting the transistors T5 in the blocked state.

This embodiment shows that a glitch can be detected on one or more word lines while the other word lines are being used for an operation on memory cells, while using a global end-of-operation signal OP.

FIG. 9 shows a glitch detection circuit DC2 according to another embodiment of the invention. The detection circuit DC2 comprises an input node N11 coupled to a word line WLm, an output node N15 supplying a glitch detection signal DETm, an inverting gate G11, a state detection, storage, and reset circuit C11, and a state change detector circuit C12.

The inverting gate G11 is coupled at its input to the node N11, and at its output to a node N12. The storage circuit C11 comprises a latch L11 comprising a latch input node N12, an intermediate node N13, an output node N14, a first two-input NAND gate G12, and a second two-input NAND gate G13. The gates G12, G13 are mounted head-to-tail, the gate G12 having one input coupled to the node N12, another input coupled to the node N13, and an output coupled to the node N14, whereas the gate G13 has one input coupled to the node N14, another input receiving the inverted end-of-operation signal /OPm, and an output coupled to the node N13. The change detector circuit C12 comprises a two-input NAND gate G14 coupled at one input to the node N12, at one input to the node N14, and at output to the node N15.

The operation of the detection circuit DC2 is similar to that shown in the timing diagram of FIG. 4, with the exception that the circuit is controlled by the inverted end-of-operation signal /OPm, which is at 1 during a detection phase ("non emitted" state) and at 0 ("emitted" state) to reset the stored state SSm of the latch L11. Furthermore, the detection signal /DETm goes to 0 when a glitch is detected.

FIG. 10 shows a detection circuit DC2' according to another embodiment of the invention. The detection circuit DC2' is similar to the detection circuit DC2 described in relation with FIG. 9, with the same references designating the same features, and further comprises a glitch detection storage circuit C13. The storage circuit C13 receives at input the glitch detection signal /DETm and stores it until reset by an inverted reset signal /RSTm. The signal /RSTm is supplied by the host processor and is for example applied upon power-up and after each glitch detection, so as to reset the stored glitch detection signal.

The storage circuit C13 comprises a latch L12 comprising a first two-input NAND gate G15, a second two-input NAND gate G16, an intermediate node N16, and a storage node N17. The gates G15, G16 are mounted head-to-tail, the gate G15 having one input coupled to the node N15, another input coupled to the node N17, and an output coupled to the node N16, whereas the gate G16 has one input coupled to the node N16, another input receiving the inverted reset signal /RSTm, and an output coupled to the node N17.

The operation of the detection circuit DC2' is similar to that shown in the timing diagram of FIG. 6, with the exception that the end-of-operation signal /OPm and the reset signal /RSTm are normally at 1 and go to 0 to reset the stored state SSm and the stored glitch detection signal /GLTm. Furthermore, the detection signal /DETm and the stored glitch detection signal /GLTm are normally at 1 and go to 0 when a glitch is detected.

FIG. 11 shows a plurality of word lines WL0, WL1 . . . , each coupled to a detection circuit DC2" according to another embodiment of the invention, the detection circuits DC2" forming the group GP of detection circuits receiving the same end-of-operation signal /OP and the same reset signal /RST.

The detection circuits DC2" are cascade connected so that each detection circuit except for the first one receives the glitch detection signal supplied by a preceding detection circuit, and switches into a glitch detection state when the preceding detection circuit is itself in the glitch detection state, the last circuit DC2" supplying a global glitch detection signal /GLT.

More particularly, the detection circuits DC2" each comprise a glitch detection latch circuit C13', which differs from the latch circuit C13 previously described in that the latch L12' comprises a three-input NAND gate G15' instead of the two-input NAND gate G15. The gate G15' has one input coupled to its own latch input node N15, one input coupled to its own latch output node N17, and one input coupled to the output node N17 of the detection circuit coupled to the preceding word line $WL_{m-1}$. Likewise, each output node N17 is coupled to an input of the gate G15' of the detection circuit DC2" coupled to the subsequent word line $WL_{m+1}$. Consequently, if a stored glitch detection signal GLTm goes to 0, the NAND gate N15' of each subsequent detection circuit propagates the detected glitch onwards through the entire remaining group of word line detection circuits, regardless of whether a glitch is detected on those word lines. The detection circuit DC2" coupled to the first word line WL0 of the memory array has one of the inputs of its gate N15' tied to a voltage source VS. Alternatively, the first word line WL0 may be coupled to a detection circuit DC2' as described in relation with FIG. 10, i.e. with a two-input NAND gate N15. The subsequent word lines WL1 to $WL_{M-1}$ are then each coupled to the detection circuit DC2".

FIG. 12 shows a plurality of word lines WL0, WL1 . . . $WL_{M-1}$, each coupled to a detection circuit DC3 according to yet another embodiment of the invention. Rather than storing the high state of the state signal of the word line, and comparing it with the current state signal of the word line, the detection circuit DC3 directly detects a falling edge of the state signal present on the word line while an operation is being executed. The presence of that falling edge implies the prior presence of a voltage signal that is equal to or above the threshold corresponding to the logic "1" followed by a variation of that voltage signal below the threshold of the logic "1", corresponding to the logic "0".

Each detection circuit DC3 comprises a falling edge detection and storage circuit C21 having an input node N21 coupled to a word line WLm and an output node N23 supplying a glitch detection signal /DETm (/DET0, /DET1 . . . /DETM–1). A glitch detection storage circuit C13', such as the one described in relation with FIG. 11, may be provided at output of the circuit C21 to latch the glitch detection signal.

The circuit C21 comprises an inverting gate G21 and a flip-flop D1. The flip-flop D1 comprises a clock input CK, a data input D, a reset input /R, and an inverted output /Q.

The input CK is coupled to the input node N21 by means of the inverting gate G21, which supplies the inverted word line signal /CSm. The input D receives a detection enable signal DEN, which may vary between 0 and 1, or be permanently at 1, such as the supply voltage of the circuit. The reset input /R receives the inverted end-of-operation signal /OP, and the output /Q supplies the inverted detection signal /DET. When the signal /OP is set to 0, the flip-flop D1 is initialized and the detection signal /DET on the output /Q is set to 1. When the signal /OP is set to 1, a falling edge of the signal on the word line may be detected. When such a falling edge appears, the output /Q of the flip-flop D1 goes to 0.

It will be understood by those skilled in the art that the detection on a word line of a signal having a high logic value corresponding to the logic "1", may be performed in a different way. For example, in an alternative embodiment based on the detection of a falling edge, rather than the flip-flop D1 being reset by the end-of-operation signal OP, a falling edge detection signal is set to 1 and simply compared, for example using an AND logic gate, with the value of the end-of-operation signal OP. Likewise, rather than detecting a falling edge, a rising edge may be detected, depending on the logic values of the signals.

In one embodiment, instead of the end-of-operation signal OP being applied to the control terminals of the two transistors T1, T3 shown in FIGS. 3, 5, 7, the signal may be split into individual signals, for example a detection enable signal applied to the control terminals of the transistors T1, and a stored state reset signal applied to the control terminals of the transistors T3. The detection enable signal may therefore be maintained at the logic value 1 to block the transistor T1 when it is not desired to implement the glitch detection, and may switch to 0 to enable the glitch detection.

In one embodiment, rather than propagating a stored glitch detection signal, for example GLT0, through a plurality of glitch detection circuits, as shown in FIGS. 7, 11 and 12, the detection signals DET0, DET1 . . . $DET_{M-1}$ or the stored glitch detection signals GLT0, GLT1 . . . $GLT_{M-1}$ may be applied to the input of one or more OR logic gates, such that if any one signal goes to 1, a resulting signal also goes to 1.

It also goes without saying that the transistors used may be of P type or of N type, that the signals OP, CS, /CS, SS, RST, DET, GLT may be inverted, and that different logic gates, latch configurations, etc., may be implemented.

As indicated previously, those skilled in the art will understand that the state signal equal to the logic "0" may correspond to a ground potential on the word line, or to a potential below a threshold, while a state signal at 1 may correspond to a voltage applied to the word line that is above the threshold. Thus, a voltage threshold may be set, below which a signal is considered to be at the logic "0".

Those skilled in the art will also understand that some signals described above may be supplied by the host processor HC or supplied to the latter. In particular, the signals DET, /DET, GLT, /GLT may be communicated to the host processor, so that it may take the appropriate security measures in response to the detection of an unauthorized glitch, such as repeating an operation, erasing memory cells, freezing the functioning of the device, setting a flag, etc.

Moreover, although the description above was of embodiments in which a falling edge is no longer detected when the end-of-operation signal is at its end-of-operation value, i.e. "1" in the examples described, which results in the glitch detection signal not being emitted, equivalent embodiments may provide for a permanent falling edge detection, independent of the value of the end-of-operation signal, and only provide for an inhibition of the supply of the glitch detection signal when the end-of-operation signal is at 1, such an inhibition being equivalent to an absence of detection. In that case, the detection means should be reset in another way, for example by means of another signal or by using the falling edge of the end-of-operation signal as a reset means, to initiate a new detection phase.

Moreover, although the description above was of embodiments of the invention relating to the detection of an unauthorized glitch on a word line, these embodiments may also apply to the detection of glitches on other lines of the memory, such as control gate lines or memory array erase lines (not shown) and, generally, any control line that does not need to be precharged with a direct voltage.

The invention claimed is:

1. A memory comprising:
   a control circuit for executing an operation on memory cells, wherein the control circuit is configured to emit an end-of-operation signal, the end-of-operation signal having a first logic value during execution of the operation and a second logic value at the end of the execution of the operation, the second logic value being opposite the first logic value,
   at least one memory line to which the memory cells are coupled, wherein the control circuit controls the operation via the at least one memory line, and
   at least one glitch detection circuit coupled to the memory line, the at least one glitch detection circuit being configured to supply a glitch detection signal when a falling edge of an amplitude of a voltage signal appears on the memory line only when the end-of-operation signal has the first logic value.

2. The memory according to claim 1, wherein the control circuit is configured to, once the operation is over, set the end-of-operation signal to the second logic value before ceasing to apply, to the memory line, a voltage signal corresponding to the operation, then set the end-of-operation signal to the first logic value after ceasing to apply the voltage signal corresponding to the operation to the memory line.

3. The memory according to claim 2, wherein the control circuit is configured to, once the operation is over, set the end-of-operation signal to the second logic value for less than 20 nanoseconds.

4. The memory according to claim 1, wherein the glitch detection circuit comprises:
   detection means configured to transform a voltage signal present on the memory line into a control logic signal having the first logic value when the amplitude of the voltage signal is below a threshold and the second logic value when the amplitude of the voltage signal is above the threshold,
   storing means for storing a switching of the control logic signal from the first to the second logic value, and
   means for supplying the glitch detection signal when the control logic signal has the first logic value while the storing means have stored the switching of the control logic signal to the second logic value and while the end-of-operation signal has the second logic value.

5. The memory according to claim 4, wherein the storing means are configured to be erased when the end-of-operation signal changes from the first logic value to the second logic value.

6. The memory according to claim 1, wherein the glitch detection circuit comprises:
   detection means configured to transform a voltage signal present on the memory line into a control logic signal having the first logic value when the amplitude of the voltage signal is below a threshold and the second logic value when the amplitude of the voltage signal is above the threshold, and
   a logic flip-flop configured to supply the glitch detection signal when the control logic signal changes from the second logic value to the first logic value.

7. The memory according to claim 1, wherein the glitch detection circuit comprises a glitch storage circuit that is configured to persist the glitch detection signal after the end-of-operation signal changes from the first logic value to the second logic value.

8. The memory according to claim 1, wherein the memory line is a word line, a control gate line, or an erase line.

9. The memory according to claim 1, further comprising:
   a plurality of memory lines;
   a plurality of glitch detection circuits each coupled to a respective memory line and each receiving the end-of-operation signal; and
   a circuit configured to supply a collective glitch detection signal that is a function of individual glitch detection signals supplied by the detection circuits.

10. The memory according to claim 1, wherein the operation is one of reading, writing, and/or erasing a memory cell.

11. The memory according to claim 1, wherein the control circuit is configured to set the end-of-operation signal to the second logic value when the control circuit does not execute any operation on memory cells, and to detect a glitch outside periods when operations are performed on memory cells.

12. A method for monitoring a line of a memory susceptible of receiving a glitch that may be representative of a fault injection attack, the memory comprising memory cells coupled to the memory line, the method comprising:
   during execution of an operation on at least one memory cell, applying a voltage signal on the memory line to perform the operation,
   emitting an end-of-operation signal having a first logic value during execution of an operation on at least one memory cell and a second logic value at the end of the execution of the operation, the second logic value being opposite the first logic value, and
   supplying a glitch detection signal when a falling edge of an amplitude of a voltage signal appears on the memory line only when the end-of-operation signal has the first logic value.

13. The method according to claim 12, further comprising:
   once the operation is over, setting the end-of-operation signal to the second logic value before ceasing to apply, to the memory line, a voltage signal corresponding to the operation, then setting the end-of-operation signal to the first logic value after ceasing to apply the voltage signal corresponding to the operation to the memory line.

14. The method according to claim 13, wherein the end-of-operation signal is set to the second logic value for less than 20 nanoseconds.

15. The method according to claim 12, further comprising setting the end-of-operation signal to the first logic value when no operation is executed on the memory cells, to detect a glitch outside periods when operations are performed on the memory cells.

16. A memory comprising:
a control circuit for executing an operation on memory cells;
at least one memory line to which the memory cells are coupled; and
at least one glitch detection circuit coupled to the at least one memory line,
wherein:
the control circuit is configured to:
during the execution of the operation on at least one memory cell of the memory cells, apply a voltage signal on the memory line to perform the operation, and
emit an end-of-operation logic signal that has a first logic value during the execution of the operation and a second logic value at the end of the execution of an operation; and
the at least one glitch detection circuit is configured to supply a glitch detection signal when a falling edge of an amplitude of the voltage signal appears on the memory line only when the end-of-operation logic signal has the first logic value.

17. The memory according to claim 16, wherein the glitch detection circuit comprises:
detection means configured to transform a voltage signal present on the at least one memory line into a control logic signal having the first logic value when the amplitude of the voltage signal is below a threshold and the second logic value when the amplitude of the voltage signal is above the threshold;
storing means for storing a switching of the control logic signal from the first logic value to the second logic value; and
means for supplying the glitch detection signal when the control logic signal has the first logic value while the storing means have stored the switching of the control logic signal to the second logic value, and while the end-of-operation logic signal has the first logic value.

18. The memory according to claim 17, wherein the storing means are configured to be erased once the end-of-operation logic signal has the second logic value.

19. The memory according to claim 16, wherein the glitch detection circuit comprises:
detection means configured to transform a voltage signal present on the memory line into a control logic signal having the first logic value when the amplitude of the voltage signal is below a threshold and the second logic value when the amplitude of the voltage signal is above the threshold, and
a logic flip-flop configured to supply the glitch detection signal when the control logic signal changes from the second logic value to the first logic value.

20. The memory according to claim 16, wherein the glitch detection circuit comprises a glitch storage circuit configured to persist the glitch detection signal after the end-of-operation signal has been set to the second logic value.

21. The memory according to claim 16, comprising a plurality of memory lines and a plurality of glitch detection circuits each coupled to a memory line and each receiving the end-of-operation logic signal, and a circuit configured to supply a collective glitch detection signal that is a function of individual glitch detection signals supplied by the detection circuits.

* * * * *